(12) United States Patent
Fukuzaki

(10) Patent No.: US 11,688,617 B2
(45) Date of Patent: Jun. 27, 2023

(54) ELECTROSTATIC CAPACITANCE SENSOR

(71) Applicant: Rorze Corporation, Hiroshima (JP)

(72) Inventor: Yoshiki Fukuzaki, Kasaoka (JP)

(73) Assignee: Rorze Corporation

( * ) Notice: Subject to any disclaimer, the term of this patent is extended or adjusted under 35 U.S.C. 154(b) by 179 days.

(21) Appl. No.: 17/299,840

(22) PCT Filed: Nov. 22, 2019

(86) PCT No.: PCT/JP2019/045737
§ 371 (c)(1),
(2) Date: Jun. 4, 2021

(87) PCT Pub. No.: WO2020/121778
PCT Pub. Date: Jun. 18, 2020

(65) Prior Publication Data
US 2022/0037177 A1    Feb. 3, 2022

(30) Foreign Application Priority Data

Dec. 11, 2018 (JP) ................................ 2018-231906

(51) Int. Cl.
*G01R 1/30* (2006.01)
*G01R 17/16* (2006.01)
(Continued)

(52) U.S. Cl.
CPC .......... *H01L 21/67265* (2013.01); *G01B 7/14* (2013.01); *G01R 1/30* (2013.01);
(Continued)

(58) Field of Classification Search
CPC ......... H01L 21/67265; H01L 21/67766; H01L 21/67778; H01L 21/67751; H01L 21/6838;
(Continued)

(56) References Cited

U.S. PATENT DOCUMENTS 6,032,083 A     2/2000  Oosawa
6,326,712 B1   12/2001  Nakazawa et al.
(Continued)

FOREIGN PATENT DOCUMENTS

DE   102013204494   10/2014
EP       0836225    4/1998
(Continued)

OTHER PUBLICATIONS

International Search Report dated Dec. 24, 2019 issued in International Application No. PCT/JP2019/045737, 1 page.

*Primary Examiner* — Raul J Rios Russo
(74) *Attorney, Agent, or Firm* — Merek, Blackmon & Voorhees, LLC

(57) ABSTRACT

Provided is an electrostatic capacitance sensor which can remove an influence of a noise occurring from a static eliminator or a driving source and accurately perform measurement even on electrostatic capacitance detected by a thin-type detection unit which can be passed to a finger surface of a wafer transfer robot. The present invention is provided with an AC supply source which supplies an AC voltage to a detection unit, a parasitic capacitance compensation circuit, an operational amplifier, a differential amplifier, a phase detection means, and a low pass filter. An operational amplification output terminal is connected to an inversion input terminal of the differential amplifier through a first band pass filter, the AC supply source is connected to a non-inversion input terminal of the differential amplifier through a second band pass filter, an output terminal of the differential amplifier is connected to an input terminal of the phase detection means, and the phase detection means takes, as a reference signal, an AC signal output from the AC supply source.

4 Claims, 7 Drawing Sheets

(51) Int. Cl.
  *G01R 19/00* (2006.01)
  *H01L 21/67* (2006.01)
  *G01B 7/14* (2006.01)
  *H01L 21/677* (2006.01)
  *H01L 21/683* (2006.01)
  *G01R 19/22* (2006.01)
  *G01R 1/20* (2006.01)

(52) U.S. Cl.
  CPC ......... *G01R 17/16* (2013.01); *G01R 19/0092* (2013.01); *H01L 21/67766* (2013.01); *H01L 21/67778* (2013.01); *G01R 1/203* (2013.01); *G01R 19/0023* (2013.01); *G01R 19/22* (2013.01); *H01L 21/67751* (2013.01); *H01L 21/6838* (2013.01)

(58) Field of Classification Search
  CPC ........ H01L 21/67259; H01L 21/68707; G01B 7/14; G01B 7/023; G01B 7/003; B25J 11/0095; B25J 13/086; B25J 15/0014; B25J 19/027; B25J 15/0057; G01R 19/0092; G01R 17/16; G01R 1/30; G01R 19/0023; G01R 19/22; G01R 1/203

USPC .................. 324/72, 76.11–76.83, 123 R
  See application file for complete search history.

(56) References Cited

U.S. PATENT DOCUMENTS

| | | | | |
|---|---|---|---|---|
| 2011/0261344 | A1* | 10/2011 | De Boer | G01D 3/036 |
| | | | | 702/167 |
| 2015/0362340 | A1 | 12/2015 | Montagne | |
| 2018/0053672 | A1* | 2/2018 | Goto | H01L 21/67766 |
| 2018/0130693 | A1* | 5/2018 | Goto | H01L 21/6838 |
| 2021/0035832 | A1* | 2/2021 | Potter | H01L 21/67259 |

FOREIGN PATENT DOCUMENTS

| | | |
|---|---|---|
| EP | 1079122 | 2/2001 |
| JP | H08-335622 | 12/1996 |
| JP | 2001-132747 | 5/2001 |
| JP | 2006-084318 | 3/2006 |

* cited by examiner

ELECTROSTATIC CAPACITANCE SENSOR

FIELD OF THE INVENTION

This invention relates to an electrostatic capacitance sensor for measuring a distance between an object to be detected and the sensor, and in particular to an electrostatic capacitance detection sensor and a detection circuit that are installed in a substrate holding hand of a substrate transfer robot for transferring thin substrates such as semiconductor wafers.

BACKGROUND OF THE INVENTION

One of the methods for accurately measuring a position of an object to be detected and a distance between a substrate holding hand and a sensor detection unit is to use an electrostatic capacitance sensor. This method detects an electrostatic capacitance generated between an object to be detected and a detection unit that detects the object to be detected, and measures a distance between the object to be detected and the detection unit from a detected electrostatic capacitance value.

Specifically, it attempts to measure a distance between two surfaces by emitting a weak AC signal that is supplied from a detection circuit of the sensor from the detection unit toward the object to be detected and by detecting changes in electrostatic capacitance that occur between a detection unit surface and a surface of an object to be detected. In recent years, this electrostatic capacitance sensor has been installed in a wafer hand holding a semiconductor wafer to be used for measuring a distance between the wafer hand and the semiconductor wafer.

Reference 1 (i.e., Japanese Patent Laid Open Publication No. H08-335622) describes a fork 59b mounted on a transfer apparatus for transferring a semiconductor wafer in a processing apparatus. Sensor heads (detection units) 71a, 71b of the electrostatic capacitance sensor are attached to left and right sides of the fork 59b, respectively. See FIG. 1. The electrostatic capacitance sensor measures the electrostatic capacitance that occurs between each of the sensor heads 71a, 71b arranged on the forks 59b and the semiconductor wafer. From the measured values, it is possible to output information on the presence or absence of the semiconductor wafer, information on whether or not the semiconductor wafer and the fork 59b maintain an appropriate distance, and the like to a main controller of the transfer apparatus. Then, this main controller outputs a control signal to drive system of the transfer apparatus based on the input information, and controls the operation of the transfer apparatus.

Further, in the transfer apparatus described in reference 1, a threshold value is set for the electrostatic capacitance sensor, and when the fork 59b passes through the outer periphery of the semiconductor wafer, the electrostatic capacitance sensor and the drive system for driving the fork 59b operate in cooperation. Therefore, the position of the outer peripheral portion of the semiconductor wafer can be measured as an amount of movement of the fork 59b in the front-rear direction, and the position of the semiconductor wafer W in a horizontal direction can be measured by the electrostatic capacitance sensor that originally measures the distance in the vertical direction.

PRIOR ART

Patent Literature

Patent literature 1: Japanese Patent Laid Open Publication No. H08-335622

DISCLOSURE OF THE INVENTION

Problems to be Solved by the Invention

However, it is highly possible that the fork 59b described in reference 1 cannot accurately detect the semiconductor wafer. In recent years, semiconductors have been miniaturized to a circuit line width of about 20 nanometers. With the progress of such miniaturization, adhesion of particles to the surface to be processed of a semiconductor wafer has become a major problem. Here, one of causes of the particles adhering to the surface of the semiconductor wafer is charging of the semiconductor wafer. Semiconductor wafers are subjected to various surface treatments in each semiconductor manufacturing process. At this time, the semiconductor wafer is charged, which causes the particles to adhere to the surface of the semiconductor wafer. Further, charging of the semiconductor wafer not only attracts particles but also causes circuit patterns formed on the surface of the semiconductor wafer to be destroyed.

In order to solve such troubles, a static eliminator is installed in an internal space of a semiconductor manufacturing apparatus or a wafer transfer apparatus in order to prevent the semiconductor wafer from being charged. The static eliminator applies a voltage of a predetermined frequency to an emitter, which is a needle-shaped electrode, and causes a corona discharge between the electrode and a ground plane to generate positive ions or negative ions. Ions generated by this static eliminator move to a charged article such as a semiconductor wafer by downward air flow supplied from an FFU (Fan Filter Unit) installed in the transfer apparatus to eliminate static electricity in the article.

Since static eliminators are used while discharging by applying high voltages of several thousand to tens of thousands of volts at a predetermined frequency, they generate fluctuating electric and fluctuating magnetic fields in the surroundings. These fluctuating electric and fluctuating magnetic fields become noise and cause malfunctions in measuring instruments and electronic equipment installed in the transfer apparatus, and interfere with accurate detection of an electrostatic capacitance sensor. In addition, noise due to the operation of the drive source located inside the transfer apparatus also interferes with accurate detection of capacitance.

The present invention has been made in view of the above problems, and provides an electrostatic capacitance sensor capable of stably detecting an object to be detected even in the internal space of the transfer apparatus inside which a noise generation source such as a static eliminator is located.

Means to Solve the Invention

In order to achieve the above object, the electrostatic capacitance sensor of a preferred embodiment of the present invention is an electrostatic capacitance sensor that measures a distance between a detection unit and the object to be detected, and is provided with an AC supply source for supplying AC voltage to the detection unit, a parasitic capacitance compensation circuit, an operational amplifier, a differential amplifier, a phase detection means, and a low-pass filter. An output terminal of the operational amplifier is connected to an inverting input terminal of the differential amplifier through a first band-pass filter, the AC supply source is connected to a non-inverting input terminal of the differential amplifier through a second band-pass filter, an output terminal of the differential amplifier is connected to an input terminal of the phase detection means, and the phase detection means uses a carrier wave output from the AC supply source as a reference signal.

With the above configuration, the electrostatic capacitance sensor of the present invention can accurately detect even a minute change in capacitance without being affected by noise, and can accurately measure the distance between the detection unit and the object to be detected.

Further, a wafer transfer robot provided with the electrostatic capacitance sensor of a preferred embodiment of the present invention is characterized in that the detection unit is provided on a surface of a finger which holds the semiconductor wafer. Further, the wafer transfer apparatus provided with the wafer transfer robot including the electrostatic capacitance sensor of a preferred embodiment of the present invention in the internal space is loaded with at least an FFU that maintains the internal space in a clean state, a load port that loads a storage container for storing the semiconductor wafer and opens and closes a lid of the storage container, and a static eliminator that is installed near a ceiling of the wafer transfer apparatus to eliminate static electricity in the internal space. A preferred embodiment of the present invention is characterized in that a carrier frequency output from an AC supply source included in the electrostatic capacitance sensor is higher than a frequency of the power supply applied to the emitter of the static eliminator.

Effects of Invention

With the above configuration, the electrostatic capacitance sensor of the present invention can detect even a minute change in capacitance. Further, even if the detection unit of the electrostatic capacitance sensor of the present invention is attached to the surface of the finger of the wafer transfer robot, it does not interfere with the semiconductor wafer, and the semiconductor wafer can be transferred without trouble. In addition, since the distance between the semiconductor wafer and the finger can be accurately detected, the teaching work of the wafer transfer robot has become easier.

Each of FIG. 6A to 6E shows a film or layer of an embodiment of a detection unit included in the electrostatic capacitance sensor of the present invention.

Figure 7:
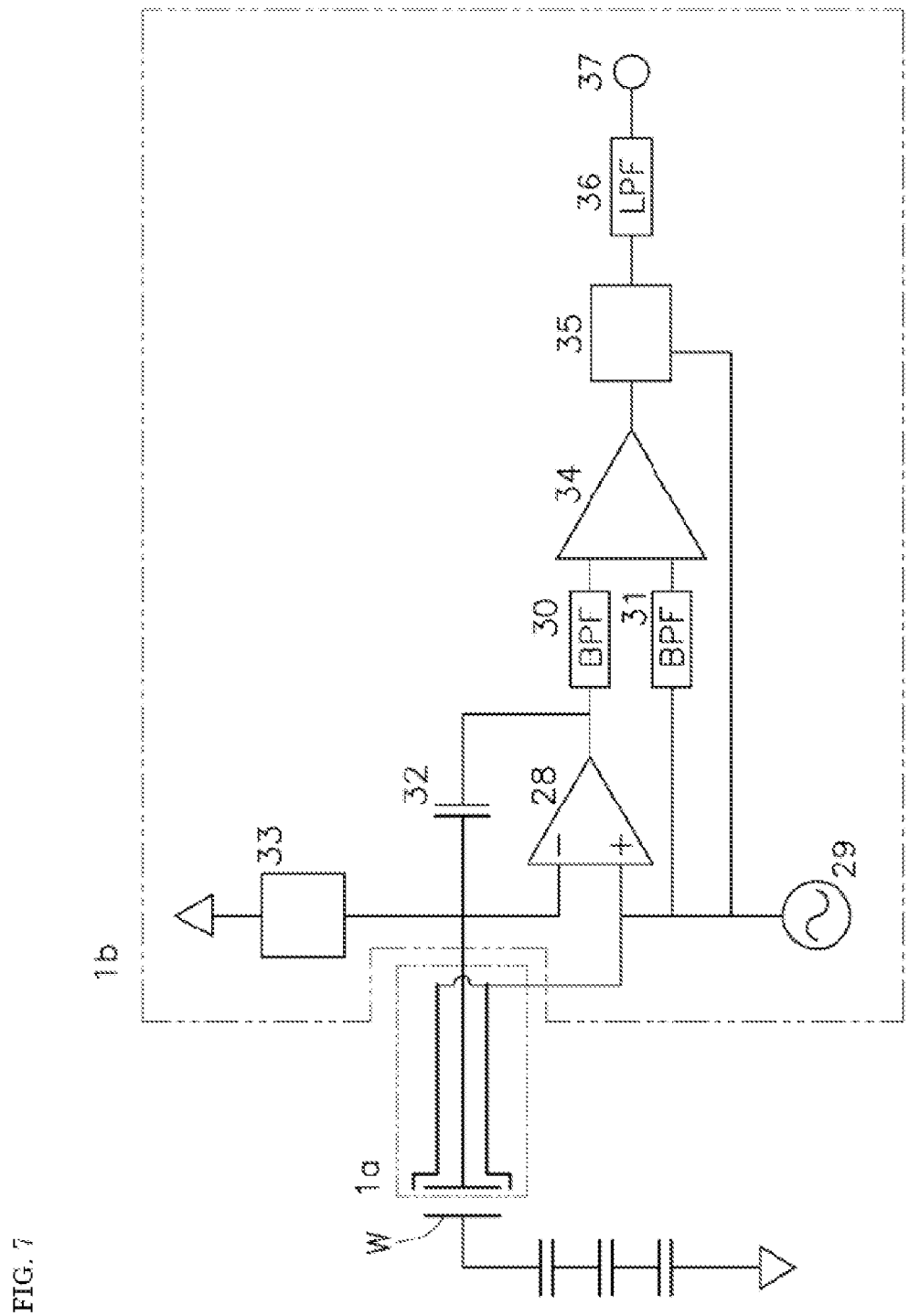

FIG. 7 is a block diagram showing a preferred embodiment of the electrostatic capacitance sensor of the present invention.

PREFERRED EMBODIMENT OF THE INVENTION

Figure 1:
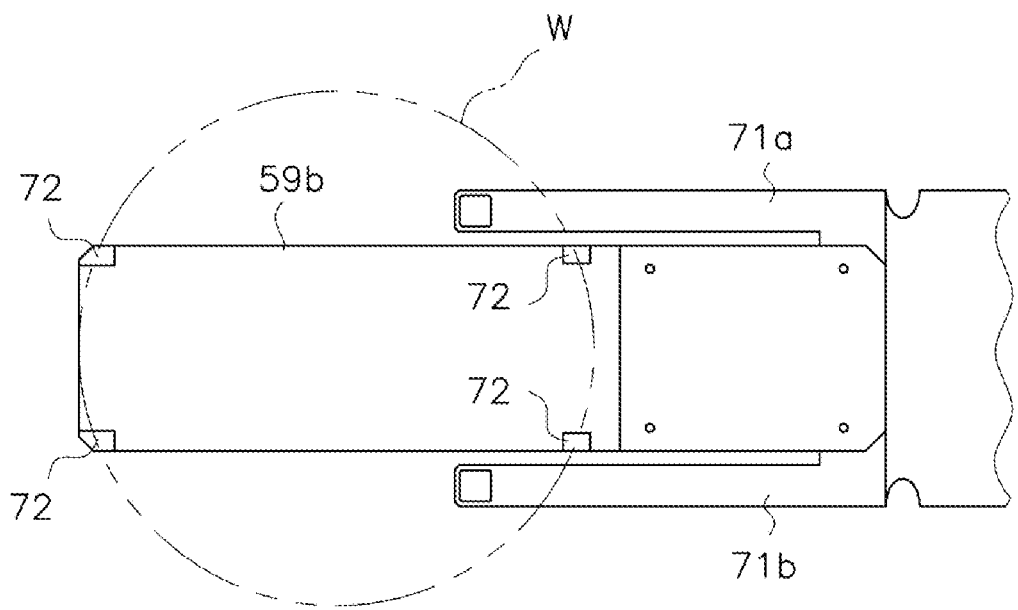
FIG. 1 shows a finger equipped with a conventional electrostatic capacitance sensor.
Figure 2:
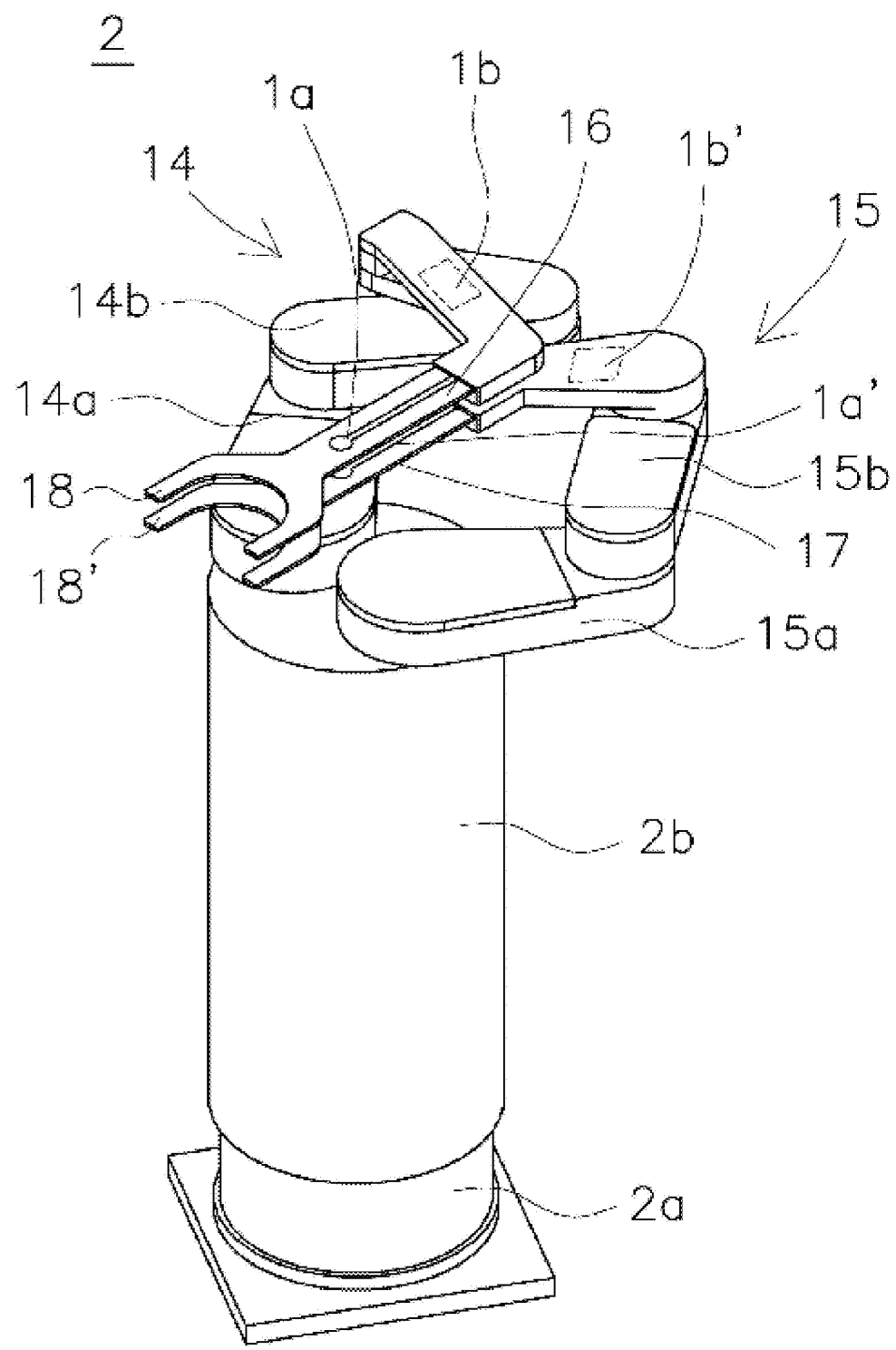
FIG. 2 shows an embodiment of a wafer transfer robot including the electrostatic capacitance sensor of the present invention.
Figure 3:
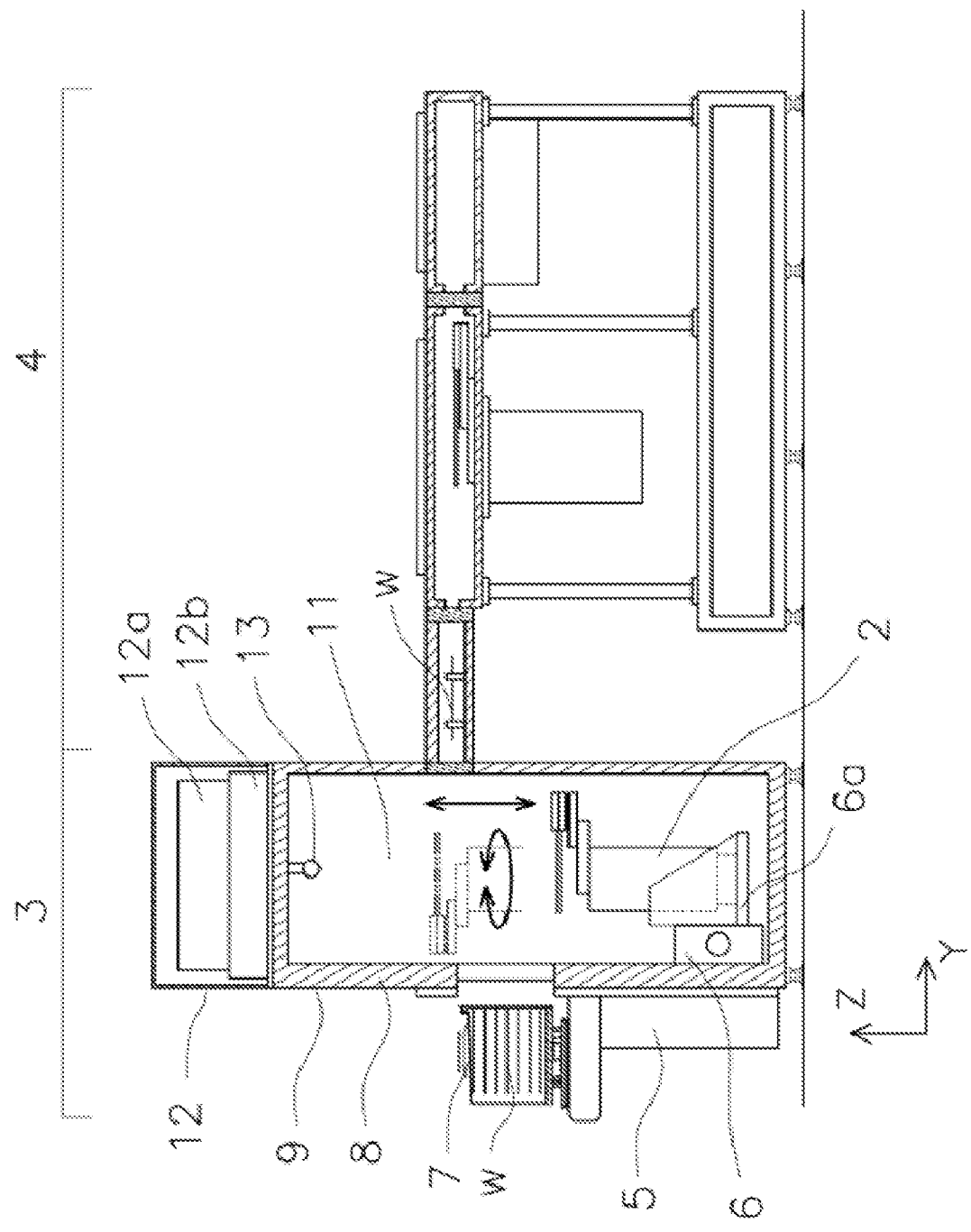
FIG. 3 shows an embodiment of a wafer transfer apparatus equipped with a wafer transfer robot including the electrostatic capacitance sensor of the present invention.
Figure 4:
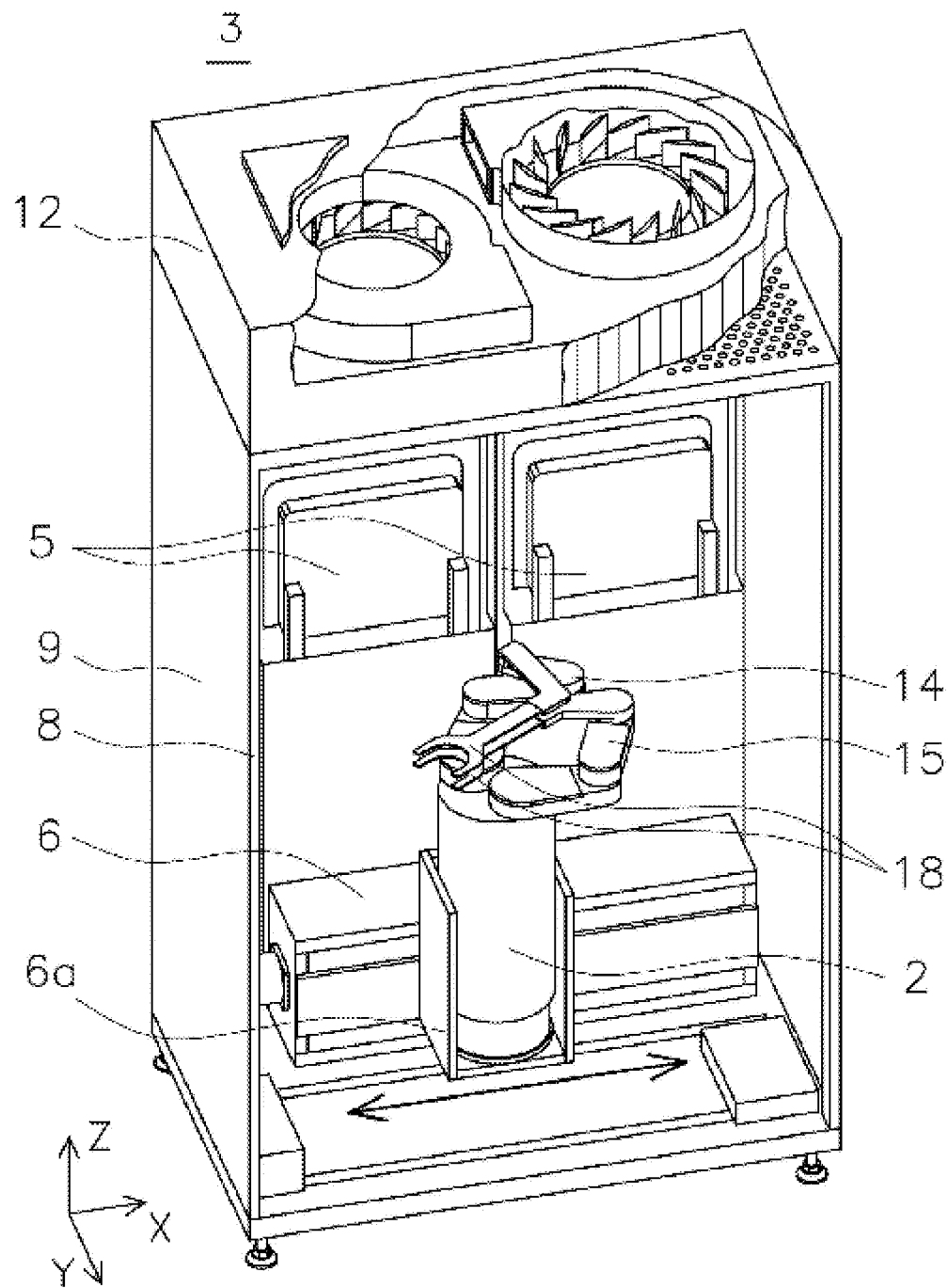
FIG. 4 shows an embodiment of a wafer transfer apparatus equipped with a wafer transfer robot including the electrostatic capacitance sensor of the present invention.

Hereinafter, preferred embodiments of the present invention will be described with reference to the drawings. FIG. 2 shows a wafer transfer robot 2 provided with an electrostatic capacitance sensor 1 according to the first embodiment of the present invention, and FIGS. 3, 4 show a wafer transfer apparatus 3 on which the wafer transfer robot 2 is mounted. The wafer transfer apparatus 3 of the present embodiment is called an EFEM (Equipment Front End Unit), which is an apparatus installed on a front surface of a wafer processing apparatus 4 that performs a predetermined surface treatment on a semiconductor wafer W, and is installed in a factory controlled in a clean atmosphere called a clean room together with the wafer processing apparatus 4. The wafer transfer apparatus 3 mainly includes a load port 5, a wafer transfer robot 2, and an X-axis table 6 for moving the wafer transfer robot 2 in the horizontal direction. There are various processes in the semiconductor manufacturing process, and each process is performed by a dedicated wafer processing apparatus 4. The semiconductor wafer W being processed is stored in a state of being placed on shelf boards formed at a predetermined interval in the vertical direction inside a closed container called FOUP (Front-Opening Unified Pod) 7, and is transferred between the wafer processing apparatuses 4. The FOUP 7 transferred to the predetermined wafer processing apparatus 4 is set at a predetermined position of the load port 5 included in the wafer transfer apparatus 3.

When the FOUP 7 is set, the load port 5 operates each drive unit to open a lid of the FOUP 7 to make the semiconductor wafer W stored inside ready for transfer. The semiconductor wafer W stored in the FOUP 7 is transferred to the wafer processing apparatus 4 by the wafer transfer robot 2 included in the wafer transfer apparatus 3. Further, the wafer transfer robot 2 transfers the semiconductor wafer W surface-treated by the wafer processing apparatus 4 from the wafer processing apparatus 4 to the FOUP 7. The load port 5 is grounded through a frame 8 of the wafer transfer apparatus 3. Further, the FOUP 7 is molded of a conductive resin, and the FOUP 7 mounted on the load port 5 is also grounded. Here, the diameter of the semiconductor wafer W handled by the wafer transfer apparatus 3 of the present embodiment is 300 mm. The semiconductor wafer W is placed on the shelf board of FOUP 7, and an electrostatic capacitance is generated between the shelf board and the semiconductor wafer W. In addition, an electrostatic capacitance is also generated between the FOUP 7 and the load port 5, and when a finger 18 of the wafer transfer robot 2 described later moves the FOUP 7 in order to transfer the semiconductor wafer W, an electrostatic capacitance is generated also between the FOUP 7 and the finger 18.

The wafer transfer apparatus 3 includes a frame 8, a cover 9 fixed to the frame 8 in order to separate from the external atmosphere, an FFU 12 that cleans air from the outside into highly clean air and introduces it into an internal space 11 of the wafer transfer apparatus 3 as downflow, and a static eliminator 13 that supplies ionized air molecules to the internal space 11 of the wafer transfer apparatus 3 and eliminates static electricity and electrically neutralizes a charged article such as a semiconductor wafer W. The FFU 12 is installed on a ceiling of the wafer transfer apparatus 3, and consists of a fan 12a that sends air downward toward the internal space 11 of the wafer transfer apparatus 3 and a filter 12b that removes contaminants such as dust, organic matter present in the sent air. The static eliminator 13 is installed near the ceiling of the wafer transfer apparatus 3 and below the FFU 12. The static eliminator 13 installed in the wafer transfer apparatus 3 of the present embodiment is a corona discharge type, which electrically ionizes the surrounding air molecules by applying a high voltage supplied from an un-shown supply source to an emitter and discharging it. The ionized air molecules reach the surface of the semiconductor wafer W from the static eliminator 13 and electrically neutralize the charged semiconductor wafer W. Further, the static eliminator 13 included in the wafer transfer apparatus 3 of the present embodiment applies a voltage of 20 Hz to the emitter to ionize surrounding air molecules. The frequency of the applied voltage depends on an environment in which the static eliminator 13 is located, and in the case of the wafer transfer apparatus 3, it is about 100 Hz at the maximum.

The wafer transfer robot 2 of this embodiment includes a base 2a that is fixed to a moving part 6a of the X-axis table 6, and an elevating and rotating section 2b that can move up and down in the Z-axis direction with respect to the base 2a and that rotates on a plane (swivel plane) intersecting perpendicularly to the Z-axis direction with the central axis of the base as the rotation center. A pair of arm bodies 14, 15 configured symmetrically with each other are provided on an upper surface of the elevating and rotating section 2b. The arm bodies 14, 15 are provided with first arms 14a, 15a, second arms 14b, 15b, and wafer hands 16, 17 for holding the semiconductor wafer W, respectively. Base ends of the first arms 14a, 15a are rotatably attached to the elevating and rotating section 2b. The second arms 14b, 15b are attached to the tips of the corresponding first arms 14a, 15a, respectively, with a constant speed ratio through a belt and a pulley. The wafer hands 16, 17 are attached to the tips of the corresponding second arms 14b, 15b, respectively, with a constant speed ratio through a belt and a pulley.

The arm bodies 14, 15 are configured so that rotating motion of each first arm 14a, 15a around the central axis is transmitted to each second arm 14b, 15b and each wafer hand 16, 17 with a constant speed ratio to be converted into an extending and contracting motion in a direction perpendicular to the central axis through the central axis of the wafer transfer robot 2. Therefore, the wafer transfer robot 2 can be used to transfer wafers. Therefore, the wafer transfer robot 2 has three degrees of freedom: movement (rotating movement) to rotate the elevating and rotating section 2b around the central axis, linear movement to extend and contract the arm bodies 14, 15 in forward and backward directions and Z-axis movement (elevating movement) to move the elevating and rotating section 2b in a Z-axis direction. In addition, the X-axis table 6 has one degree of freedom of X-axis movement (parallel movement) to move the wafer transfer robot 2 in an X-axis direction. With the above configuration, the wafer transfer robot 2 can move the wafer hands 16, 17 attached to the ends of the arms to predetermined positions in the wafer transfer apparatus 3. The wafer hands 16, 17 can be moved forward and backward while maintaining predetermined postures in conjunction with extending and contracting movements of the first arms and the second arms. Each motor, which is a driving means for each of the arm bodies 14, 15, the elevating and rotating section 2b, and the X-axis table 6, has a driving shaft whose rotation angle is feedback-controlled by an unillustrated control unit included in the wafer transfer robot 2. In addition, the control unit moves the wafer hands 16, 17 along a predetermined path taught in advance. Furthermore, the control unit is configured to receive signals from the electrostatic capacitance sensor 1 and other detection means and to correct the positions of the wafer hands 16, 17 and the wafer transfer path in accordance with a program stored in advance.

Figure 5:
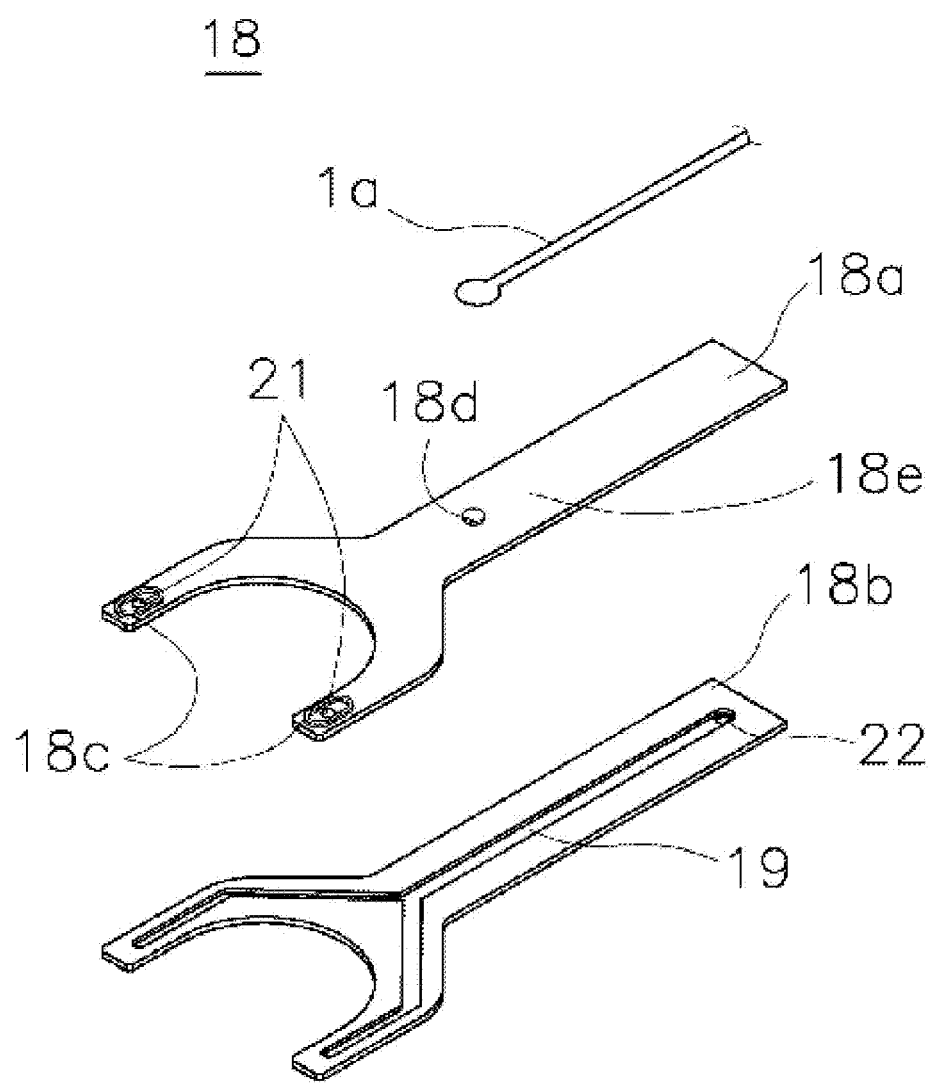
FIG. 5 shows an embodiment of a finger in which the electrostatic capacitance sensor of the present invention is arranged.
Figure 6A:
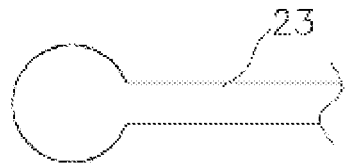
Figure 6B:
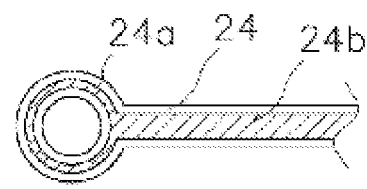
Figure 6C:
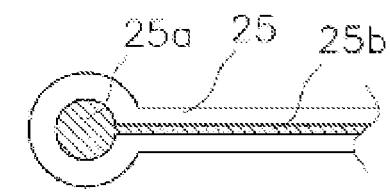
Figure 6D:
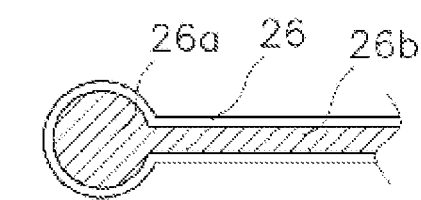
Figure 6E:
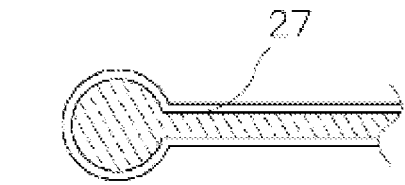

The wafer hands 16, 17 are provided with fingers 18, 18', which are wafer holding means, respectively. A detection unit 1a is located on a surface of the finger 18 arranged upper to be connected to an amplifier module 1b arranged inside the finger 18. In addition, a detection unit 1a' is located on a surface of the finger 18' arranged below to be connected to an amplifier module 1b' arranged inside the finger 18'. FIG. 5 shows a finger 18 of the present embodiment. The finger 18 of the present embodiment is configured by airtightly bonding two plate-shaped members 18a, 18b formed in a substantially Y shape. The two plate-shaped members 18a, 18b are made of a light-weight and highly rigid sintered material such as alumina, and the semiconductor wafer W is placed on the top surface of the upper plate-shaped member 18a. A flow path 19 is formed in a substantially Y shape on the top surface of the lower plate-shaped member 18b. Further, holes 21 penetrating the upper plate-shaped member 18a in the vertical direction are formed on the tips of the upper plate-shaped member 18a so as to correspond to the flow path 19. Further, a hole 22 penetrating the lower plate-shaped member 18b in the vertical direction is formed on the base end portion of the lower plate-shaped member 18b so as to correspond to the flow path 19. The hole 22 formed in the lower plate-shaped member 18b communicates with a vacuum source (not shown) through a pipe (not shown) provided in the wafer transfer robot 2, and when the upper and lower plate-shaped members 18a, 18b are airtightly bonded, the flow path 19 forms a vacuum path, and the semiconductor wafer W placed on the finger 18 is held on the finger 18 by vacuum adsorption.

An ellipsoidal adsorption spacer 18c is formed around the hole 21 on the top surface of the upper plate-shaped member 18a so as to surround the hole 21. The adsorption spacer 18c is formed in the shape of a bank raised by about 1.5 mm from the surface of the finger 18, and acts as an adsorption pad to adsorb the semiconductor wafer W. In addition, a support spacer 18d is formed at the center of the finger 18. The support spacer 18d is formed in a trapezoidal shape raised by about 1.5 mm in the same way as the adsorption spacer 18c. According to this, the semiconductor wafer W is adsorbed and supported by the adsorption spacer 18c and the support spacer 18d in a state where it floats by 1.5 mm above the finger reference surface 18e on the finger 18.

Furthermore, the detection unit 1a of the electrostatic capacitance sensor 1, which is an embodiment of the present invention, is affixed to a reference surface 18e of the substantially Y-shaped finger 18. The electrostatic capacitance sensor 1 of this embodiment can measure a distance between the semiconductor wafer W and the fingers 18 (wafer hands 16, 17) by detecting the electrostatic capacitance between the detection unit 1a located on the fingers 18 and the semiconductor wafer W. Furthermore, it can also monitor whether or not the semiconductor wafer W is placed on the wafer hands 16, 17. The values detected by the detection unit 1a are transmitted to the amplifier module 1b, which is located inside the wafer hands 16, 17. The amplifier module 1b measures the electrostatic capacitance between the detection unit 1a and the semiconductor wafer W, and transmits the measured value to the control unit (not shown) for controlling the operation of the wafer transfer robot 2.

The control unit converts this transmitted value into the distance between the semiconductor wafer W and the fingers 18, and reflects it in the operation of the wafer transfer robot 2.

The detection unit 1a of the electrostatic capacitance sensor 1 in this embodiment is installed on the surface on which the semiconductor wafer W is placed of the finger 18. The detection unit 1a has a thickness dimension of about 0.2 mm, and has electrodes and wiring formed with conductive metal represented by copper foil on a base film of flexible material with insulation such as polyimide. FIGS. 6A to 6E collectively show the detection unit 1a of this embodiment. The detection unit 1a of this embodiment has a structure in which guard electrode layers 24, 26, a sensor electrode layer 25, and a shield ground layer 27 are laminated. The first guard electrode layer 24 on which a first guard electrode 24a is formed is located on the first layer which is the top surface of the electrode layers, and the sensor electrode layer 25 on which a sensor electrode 25a is formed is located on the second layer, the second guard electrode layer 26 on which a sensor electrode 26a is formed is located on the third layer, and the shield ground layer 27 is located on the fourth layer. In addition, a protective film 23 is disposed on the top surface of the first guard electrode layer 24 to protect the first guard electrode layer 24. The detection unit 1a of this embodiment has a height dimension of about 1 mm and is used by being attached to the reference surface 18e of the finger 18. Since the adsorption spacer 18c and the support spacer 18d are formed with a height dimension of about 1.5 mm, they do not interfere with the semiconductor wafer W held by the adsorption spacer 18c and the support spacer 18d of the finger 18. Although the finger 18 included in the wafer transfer robot 2 of this embodiment is in a form of adsorbing and holding the semiconductor wafer W by vacuum pressure, the present invention is not limited thereto, and is applicable, for example, to a clamp-type finger or a Bernoulli chuck-type finger that grasps the periphery of the semiconductor wafer W.

A sensor electrode 25a is a circular electrode for detecting the electrostatic capacitance generated between the sensor and the semiconductor wafer W, and is formed on the top surface of the base film A first guard electrode 24a formed in the first guard electrode layer 24 has an inner diameter larger than the outer diameter of a sensor electrode 25a, and is formed on the top surface of the base film in an annular shape so as to surround the sensor electrode 25a. The sensor electrode 25a and the first guard electrode 24a are electrically insulated by the base film. A second guard electrode 26a formed in the second guard electrode layer 26 is formed in a circular shape having the same diameter as the outer diameter of the first guard electrode 24a formed in the first guard electrode layer 24. In addition, the shield ground layer 27, which is the fourth layer, is located below the second guard electrode layer 26 in which the second guard electrode 26a is formed. Besides, although the second guard electrode 26a in this embodiment has the same diameter as the outer diameter of the first guard electrode 24a, the present invention is not limited thereto, and the diameter of the second guard electrode 26a may be formed larger than the outer diameter of the first guard electrode 24a.

The shield ground layer 27 is an electrode made of conductive metal, such as copper foil, formed into a circular shape with the same diameter as the first and second guard electrode layers 24, 26, and is connected to a ground terminal of the wafer transfer apparatus 3 through an ground wire (not shown). This shield ground layer 27 prevents the influence of the electric field radiated from the guard electrodes 24a, 26a from going downward, so that the electrostatic capacitance sensor 1 is not affected by the object to be detected that exists below the detection unit 1a, and can measure only the electrostatic capacitance generated between the object to be detected above the finger 18 and the detection unit 1a.

A linear circuit pattern 25b for electrically connecting the sensor electrode 25a and the inverting input terminal of an operational amplifier 28 of the amplifier module 1b is formed in the sensor electrode 25a included in the sensor electrode layer 25 that is the second layer. A linear circuit pattern 24b for electrically connecting the first guard electrode 24a and the non-inverting input terminal of the operational amplifier 28 of the amplifier module 1b is formed in the first guard electrode 24a included in the first guard electrode layer 24 that is the first layer so as to be parallel to the circuit pattern 25b connected to the sensor electrode 25a. A linear circuit pattern 26b for electrically connecting the second guard electrode 26a and the non-inverting input terminal of the operational amplifier 28 of the amplifier module 1b is formed in the second guard electrode 26a included in the second guard electrode layer 26 that is the third layer so as to be parallel to the circuit pattern 25b connected to the sensor electrode 25a. The width dimensions of the circuit patterns 24b, 26b connected to each of the guard electrodes 24a, 26a are formed so as to be thicker than the circuit pattern 25b connected to the sensor electrode 25a. With the above configuration, the circuit pattern 25b connected to the sensor electrode 25a is placed so as to be sandwiched from the vertical direction by the circuit patterns 24b, 26b connected to the guard electrodes 24a, 26a, and therefore, the influence of noise on the circuit pattern 25b connected to the sensor electrode 25a is reduced.

Further, on the top surface of the first layer, a protective film 23 that is an insulating layer made of the same material as the base film is arranged. The protective film 23 has the same external dimensions as the first layer 24 to the fourth layer 27. The sensor electrode formed in the detection unit 1a of the present embodiment is formed in a circular shape having a diameter of about 15 mm. The first guard electrode 24a is formed in a substantially annular shape having an inner diameter of about 16 mm and an outer diameter of 19 mm. The second guard electrode 26a is formed in a circular shape having a diameter of 20 mm. The external dimensions of the detection unit 1a are not limited to this embodiment, and can be appropriately changed depending on the situation. Further, although the electrodes 24a, 25a, and 26a are formed on individual base films in the detection unit 1a of the present embodiment, the electrostatic capacitance sensor 1 of the present invention is not limited to this. For example, the first guard electrode 24a and the circuit pattern 24b can be formed on the top surface of the base film of the first guard electrode layer 24, and the sensor electrode 25a and the circuit pattern 25b can be formed on the opposite surface of the base film. Furthermore, the sensor electrode 25a and the circuit pattern 25b can be formed on the top surface of the base film of the sensor electrode layer 25, and the second guard electrode 26a and the circuit pattern 26b can be formed on the opposite surface of the base film Besides, in the case of forming the electrodes and circuit patterns on both surfaces of the base film, it is necessary to sandwich an insulating protective film between them in order to prevent electrical contact with adjacent layers.

Next, the amplifier module 1b will be explained. FIG. 7 shows a block diagram of the electrostatic capacitance sensor 1 of this embodiment. The sensor electrode 25a of the detection unit 1a is connected to the inverting input terminal of the operational amplifier 28 provided by the amplifier module 1*b*, and the guard electrodes 24*a*, 26*a* of the detection unit 1*a* are connected to the non-inverting input terminal of the operational amplifier 28. An AC voltage from an AC supply source 29 is applied to the non-inverting input terminal of the operational amplifier 28. Besides, the AC supply source 29 provided by the amplifier module 1*b* of this embodiment is configured to output a carrier wave for transmitting the electrostatic capacitance detected by the detection unit 1*a* at a frequency of 200 kHz with a voltage of 2 V. The AC supply source 29 also applies the same AC voltage to a second BPF (bandpass filter) 31 provided by the amplifier module 1*b*. Furthermore, the output terminal of the operational amplifier 28 is connected to a first BPF 30 provided by the amplifier module 1*b*. The BPFs 30, 31 will be described later. In addition, a feedback circuit is connected between the output terminal and the inverting input terminal of the operational amplifier 28, and a reference capacitor 32 is connected to this feedback circuit. Furthermore, the inverting input terminal of the operational amplifier 28 is provided with a parasitic capacitance compensation circuit 33 to cancel out parasitic capacitance generated in the electrodes of the detection unit 1*a* and the circuit of the amplifier module 1*b*. With this parasitic capacitance compensation circuit, the parasitic capacitance generated inside the electrostatic capacitance sensor 1 is canceled out. In the circuit provided by the amplifier module 1*b* described above, the inverting input terminal and the non-inverting input terminal of the operational amplifier 28 are in a virtual short circuit state, and the inverting input terminal and the non-inverting input terminal are at approximately the same potential as each other. Therefore, the sensor electrode 25*a* is guarded by the guard electrodes 24*a*, 26*a*.

The output terminal of the operational amplifier 28 is connected to the inverting input terminal of a differential amplifier 34 provided by the amplifier module 1*b* through the first BPF 30 for passing only signals in a predetermined frequency band. The non-inverting input terminal of the differential amplifier 34 is also connected to the AC supply source 29 through the second BPF 31. Noise components generated from the semiconductor wafer W which are detected by the sensor detection unit 1*a* can be removed by connecting the output terminal and the non-inverting input terminal of the operational amplifier 28 to the differential amplifier 34 through the first BPF 30 and the second BPF 31. Here, in a signal amplification circuit, it is common to remove the noise components after amplifying the signal from the detection means by the differential amplifier 34. However, in this method, the noise is amplified along with the signal amplification, and a noise voltage is increased. If the noise voltage is large, the differential amplifier 34 is saturated to lose the signal. Therefore, in the amplifier module 1*b* of this embodiment, the noise components existing in a relatively narrow band are first removed by the first BPF 30, and then signals are amplified by the differential amplifier 34. Further, gains of the differential amplifier 34 included in the amplifier module 1*b* of this embodiment are set to 100 times. Therefore, saturation of the differential amplifier 34 can be prevented to proceed the signal normally.

Further, the amplifier module 1*b* of this embodiment is provided with two BPFs: one BPF 30 connected to the output terminal of the operational amplifier 28 and the other BPF 31 connected to the output terminal of the AC supply source 29. This is because the signal output from the output terminal of the operational amplifier 28 is transmitted to the differential amplifier 34 with a delay with respect to the AC carrier wave output from the AC supply source 29 and the differential amplifier 34 does not amplify the difference accurately when extracting the difference between the signal output from the output terminal of the operational amplifier 28 and the AC carrier wave output from the AC supply source 29. Therefore, by allowing the carrier wave output from the AC supply source 29 to also pass through the BPF 31, the timing of the output signal from the operational amplifier 28 and the carrier wave output from the AC supply source 29 are matched. According to this, the delay in the signal output from the output terminal of the operational amplifier 28 can be eliminated. In addition, the BPFs 30, 31 included in the amplifier module 1*b* are set to remove frequency components other than the frequency around 200 kHz output by the AC supply source 29. According to this, low frequency noises generated by the static eliminator 13 located in the wafer transfer apparatus 3 and noises generated by the drive source of the wafer transfer robot 2 can be effectively removed.

The inverting input terminal of the differential amplifier 34 is connected to the output terminal of the operational amplifier 28 through the BPF 30, and the non-inverting input terminal of the differential amplifier 34 is connected to the non-inverting input terminal of the operational amplifier 28 and the output terminal of the AC supply source 29 through the BPF 31. The signal components including the AC carrier wave from the AC supply source 29 connected to the non-inverting input terminal of the differential amplifier 34 and the electrostatic capacitance components output from the output terminal of the operational amplifier 28 to the inverting input terminal of the differential amplifier 34 through the BPF 31 are amplified to be output to a phase detection means 35.

The phase detection means 35 included in the amplifier module 1*b* of this embodiment extracts the electrostatic capacitance detected by the detection unit 1*a* from the signal amplified by the differential amplifier 34 using the carrier wave of 2V and 200 kHz output from the AC supply source 29 as a reference signal. The signal extracted here is output to an output terminal 37 after the noises are removed by a LPF (Low-Pass Filter) 36. The output terminal 37 is connected to a control unit (not shown), and the control unit calculates the distance between the finger 18 and the semiconductor wafer W from the extracted capacitance. Since the electrostatic capacitance is inversely proportional to the separation distance between the detection unit 1*a* and the semiconductor wafer W of the object to be detected and further the area of the detection unit 1*a* is known, the separation distance between the detection unit 1*a* and the semiconductor wafer W can be easily measured by detecting the electrostatic capacitance generated between the detection unit 1*a* and the semiconductor wafer W. In addition, by detecting the change in electrostatic capacitance generated between the detection unit 1*a* and the semiconductor wafer W, the displacement between the detection unit 1*a* and the semiconductor wafer W can be measured.

As described above, the electrostatic capacitance sensor of the present invention is driven by a power supply having a relatively high frequency of about 200 kHz, so it has a configuration that can effectively remove noises of relatively low frequency components emitted from the drive source included in the static eliminator 13 and the wafer transfer robot 2, and thus, the electrostatic capacitance generated between the detection unit 1*a* and the object to be detected can be detected accurately. In addition, in the amplifier module 1*b*, the detection signal amplified by the operational amplifier 28 is attenuated by the BPF 30 to remove noises and other frequency components before being amplified by the differential amplifier 34, so that the signal can be processed without saturating the differential amplifier even when large noise is introduced.

Furthermore, since the differential amplifier 34 and the AC supply source 29 are connected through the BPF 31 equivalent to the BPF 30 placed between the operational amplifier 28 and the differential amplifier 34, the phases of the signal from the operational amplifier 28 input to the differential amplifier 34 and the carrier wave input from the AC supply source 29 are matched. According to this, the differential amplifier 34 can perform accurate differential amplification processing and effectively attenuate noise components.

As described above, since the electrostatic capacitance sensor 1 of the present invention is provided with the amplifier module 1b capable of performing signal extraction processing with high noise tolerance, the capacitance between the detection unit 1a and the object to be detected can be accurately measured even if the detection unit 1a has a relatively low detection accuracy. The electrostatic capacitance sensor 1 of the present invention can accurately measure the capacitance even if the detection unit 1a is thin with a thickness of about 1 mm. Therefore, even if the detection unit 1a is attached to the surface of the finger 18 of the wafer transfer robot 2 to be used, it will not interfere with the semiconductor wafer W held on the finger 18.

DESCRIPTION OF SYMBOLS 1 electrostatic capacitance sensor
1a, 1a' detection unit
1b, 1b' amplifier module
2 wafer transfer robot
2a base
2b rotating section
3 wafer transfer apparatus
4 wafer processing apparatus
5 load port
6 X-axis table
6a moving part
7 FOUP (Front-Opening Unified Pod)
8 frame
9 cover
11 internal space
12 FFU
12a fan
12b filter
13 static eliminator
14, 15 arm body
14a, 15a first arm
14b, 15b second arm
16, 17 wafer hand
18, 18' finger
18a upper plate-shaped member
18b lower plate-shaped member
18c adsorption spacer
18d support spacer
18e reference surface
18a, 18b plate-shaped member
19 flow path
21, 22 hole
23 protective film
24 first guard electrode layer
24a first guard electrode
24b, 25b, 26b circuit pattern
25 sensor electrode layer
25a sensor electrode
26 second guard electrode layer
26a second guard electrode
27 shield ground layer
28 operational amplifier
29 AC supply source
30 first BPF
31 second BPF
32 capacitor
33 parasitic capacitance compensation circuit
34 differential amplifier
35 phase detection means
36 LPF (Low-Pass Filter)
37 output terminal
W wafer

The invention claimed is:

1. An electrostatic capacitance sensor for measuring a distance between a detection unit and an object to be detected, comprising:
an AC supply source for supplying AC voltage to the detection unit;
a parasitic capacitance compensation circuit;
an operational amplifier;
a differential amplifier;
a phase detection means; and
a low-pass filter,
wherein an output terminal of the operational amplifier is connected to an inverting input terminal of the differential amplifier through a first band-pass filter, the AC supply source is connected to a non-inverting input terminal of the differential amplifier through a second band-pass filter, an output terminal of the differential amplifier is connected to an input terminal of the phase detection means, and the phase detection means uses an AC signal output from the AC supply source as a reference signal.

2. The electrostatic capacitance sensor claimed in claim 1 wherein the detection unit is connected to a wafer hand of a wafer transfer robot for transferring a semiconductor wafer to a predetermined position.

3. A wafer transfer apparatus, comprising:
an internal space and a wafer transfer robot located in the internal space of the wafer transfer apparatus, the wafer transfer robot having an electrostatic capacitance sensor for measuring a distance between a detection unit and an object to be detected including an AC supply source for supplying AC voltage to the detection unit, a parasitic capacitance compensation circuit, an operational amplifier, a differential amplifier, a phase detection means and a low-pass filter, wherein an output terminal of the operational amplifier is connected to an inverting input terminal of the differential amplifier through a first band-pass filter, the AC supply source is connected to a non-inverting input terminal of the differential amplifier through a second band-pass filter, an output terminal of the differential amplifier is connected to an input terminal of the phase detection means, and the phase detection means uses an AC signal output from the AC supply source as a reference signal;
a fan filter unit (FFU) for maintaining the internal space in a clean state;
a load port for loading a storage container for storing the semiconductor wafer and for opening and closing a lid of the storage container; and,
a static eliminator installed near a ceiling of the wafer transfer apparatus for eliminating static electricity in the internal space, wherein a frequency of a carrier wave output from the AC supply source is higher than a frequency of a power supply applied to an emitter of the static eliminator.

4. A wafer transfer robot, comprising:
an electrostatic capacitance sensor for measuring a distance between a detection unit and an object to be detected including an AC supply source for supplying AC voltage to the detection unit, a parasitic capacitance compensation circuit, an operational amplifier, a differential amplifier, a phase detection means and a low-pass filter, wherein an output terminal of the operational amplifier is connected to an inverting input terminal of the differential amplifier through a first band-pass filter, the AC supply source is connected to a non-inverting input terminal of the differential amplifier through a second band-pass filter, an output terminal of the differential amplifier is connected to an input terminal of the phase detection means, and the phase detection means uses an AC signal output from the AC supply source as a reference signal;
a plurality of wafer hands;
a finger provided on each of the wafer hands to hold a semiconductor wafer, and,
arm bodies for moving the wafer hands forward and backward, wherein the detection unit is located on each of the fingers.

* * * * *